United States Patent
Park

[11] Patent Number: 5,914,909
[45] Date of Patent: Jun. 22, 1999

[54] SEMICONDUCTOR MEMORY DEVICE CAPABLE OF DRIVING THE DATA BUS SENSE AMPLIFIER IN BOTH READ AND WRITE MODES

[75] Inventor: Jin Ho Park, Ichon, Rep. of Korea

[73] Assignee: Hyundai Electronics Industries Co., Ltd., Kyoungki-do, Rep. of Korea

[21] Appl. No.: 08/916,226

[22] Filed: Aug. 22, 1997

[30] Foreign Application Priority Data

Aug. 23, 1996 [KR] Rep. of Korea ............... 1996-35044

[51] Int. Cl.⁶ .................................................. G11C 8/00
[52] U.S. Cl. .................. 365/230.06; 365/233; 365/205; 365/207; 365/208; 365/189.08
[58] Field of Search ........................... 365/230.06, 233, 365/205, 207, 208, 189.08

[56] References Cited

U.S. PATENT DOCUMENTS

| | | | |
|---|---|---|---|
| 4,858,197 | 8/1989 | Aono et al. | 365/233.5 |
| 5,404,327 | 4/1995 | Houston | 365/203 |
| 5,666,324 | 9/1997 | Kosugi et al. | 365/233 |

Primary Examiner—David Nelms
Assistant Examiner—Vanthu Nguyen
Attorney, Agent, or Firm—Gary M. Nath; Harold L. Novick; Nath & Associates

[57] ABSTRACT

A semiconductor memory device having a data bus sense amplifier driving part for driving a data bus sense amplifier in a read mode in response to a global data bus line selection signal and a data bus line selection signal, a write driver driving part for driving a write driver in a write mode in response to the data bus line selection signal and a write bus line driver signal generation signal, and a logic gate for logically combining output signals from the data bus sense amplifier driving part and write driver driving part to generate a signal to drive the data bus sense amplifier in the write and read modes. The data bus sense amplifier is driven even in the write mode to change the previous data latched by a latch circuit. Therefore, in the case where data stored in a cell in the write mode is outputted in the read mode by a corresponding address and different data is then stored in the same cell, the different data can normally be read directly by the corresponding address without performing a read or write operation according to a different address.

6 Claims, 5 Drawing Sheets

SEMICONDUCTOR MEMORY DEVICE CAPABLE OF DRIVING THE DATA BUS SENSE AMPLIFIER IN BOTH READ AND WRITE MODES

BACKGROUND OF THE INVENTION

1. Field of the Invention

The present invention relates in general to an output data fail prevention circuit for a semiconductor memory device with an address transition detector, and more particularly to a semiconductor memory device in which a data bus sense amplifier is driven even in a write operation to change the previous data latched on a read data line, so that normal data can be outputted in the next operation.

2. Description of the Prior Art

Generally, an address transition detector is adapted to compare the previous and current addresses with each other. If the two addresses are the same as a result of the comparison, a data bus line is not precharged and a data bus sense amplifier is not driven. However, when the two addresses are not the same, the data bus line is precharged and data from a cell is transferred to the data bus line. Also, the data bus sense amplifier is driven to transfer the data on the data bus line to a read data line. In the case where data stored in a cell in a write mode is outputted in a read mode by a corresponding address and different data is then stored in the same cell, the different data can be read by the corresponding address after a read or write operation is performed according to a different address. Namely, only when the previous and current addresses are different from each other, the address transition detector is enabled to read normal data.

Figure 1:
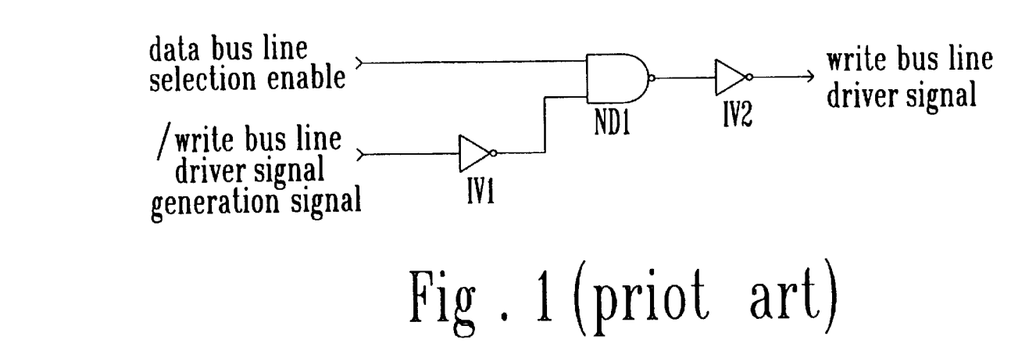
FIG. 1 is a circuit diagram illustrating the construction of a conventional circuit for driving a write driver in a write mode.

FIG. 1 is a circuit diagram illustrating the construction of a conventional circuit for driving a write driver in a write mode. As shown in this drawing, the write driver driving circuit comprises a first inverter IV1 for inverting a /write bus line driver signal generation signal, a first NAND gate ND1 for NANDing an output signal from the first inverter IV1 and a data bus line selection signal, and a second inverter IV2 for inverting an output signal from the first NAND gate ND1 and outputting the inverted signal as a write bus line driver signal.

The data bus line selection signal is enabled high in logic when a certain memory block is selected. The /write bus line driver signal generation signal is made active low in logic in the write mode and disabled high in logic in a read mode.

The operation of the write driver driving circuit with the above-mentioned construction will hereinafter be described.

In the case where the /write bus line driver signal generation signal is made active low in logic under the condition that the data bus line selection signal is made active high in logic, the output signal from the first NAND gate ND1 becomes low in logic. The low logic signal from the first NAND gate ND1 is inverted into high in logic by the second inverter IV2 and then outputted as the write bus line driver signal to drive the write driver as shown in FIG. 4.

Figure 4:
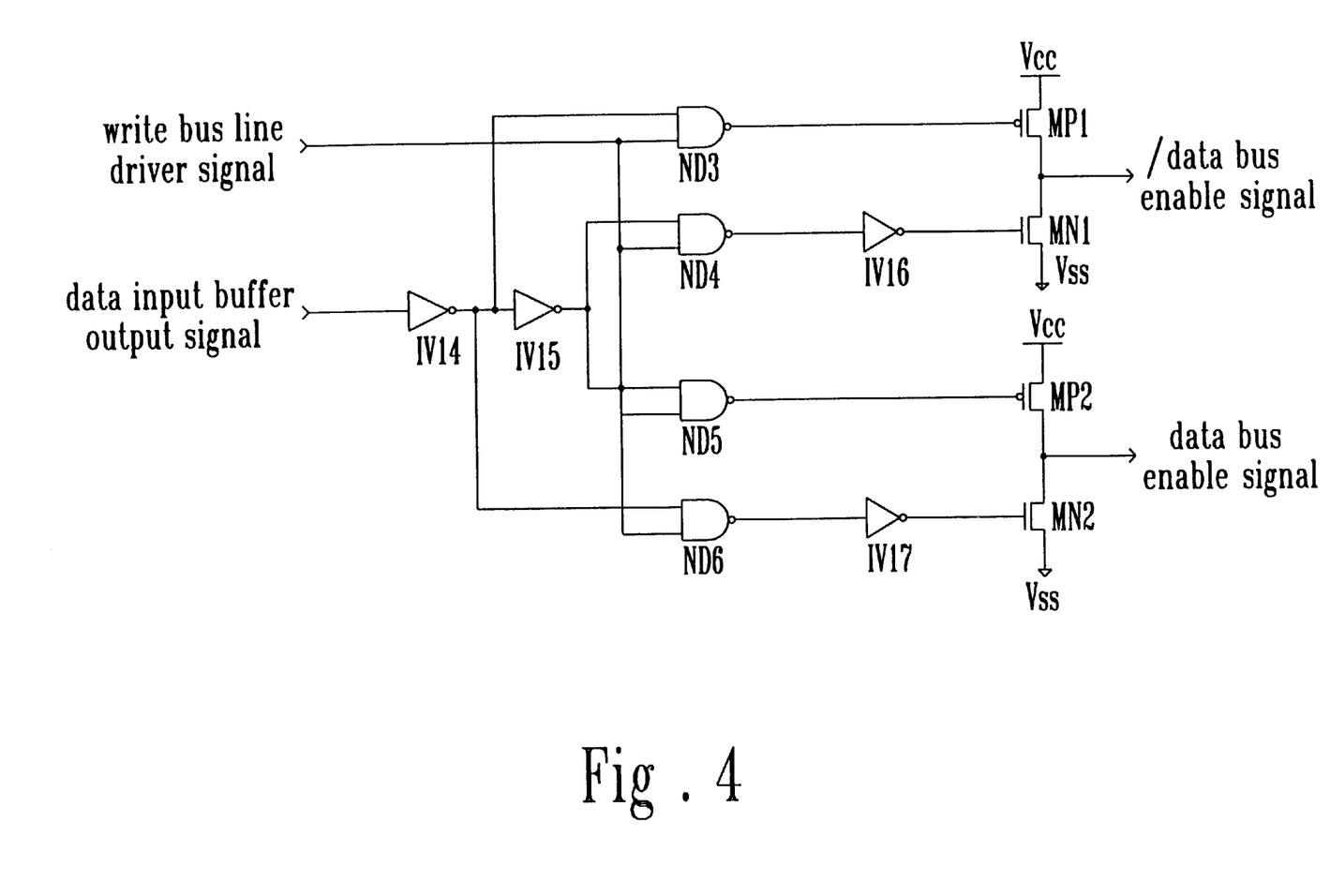
FIG. 4 is a circuit diagram illustrating the construction of the write driver, which drives a data bus line in the write mode.

As a result, a high logic signal is applied to a write bus line driver signal input terminal of the write driver in FIG. 4.

Figure 5:
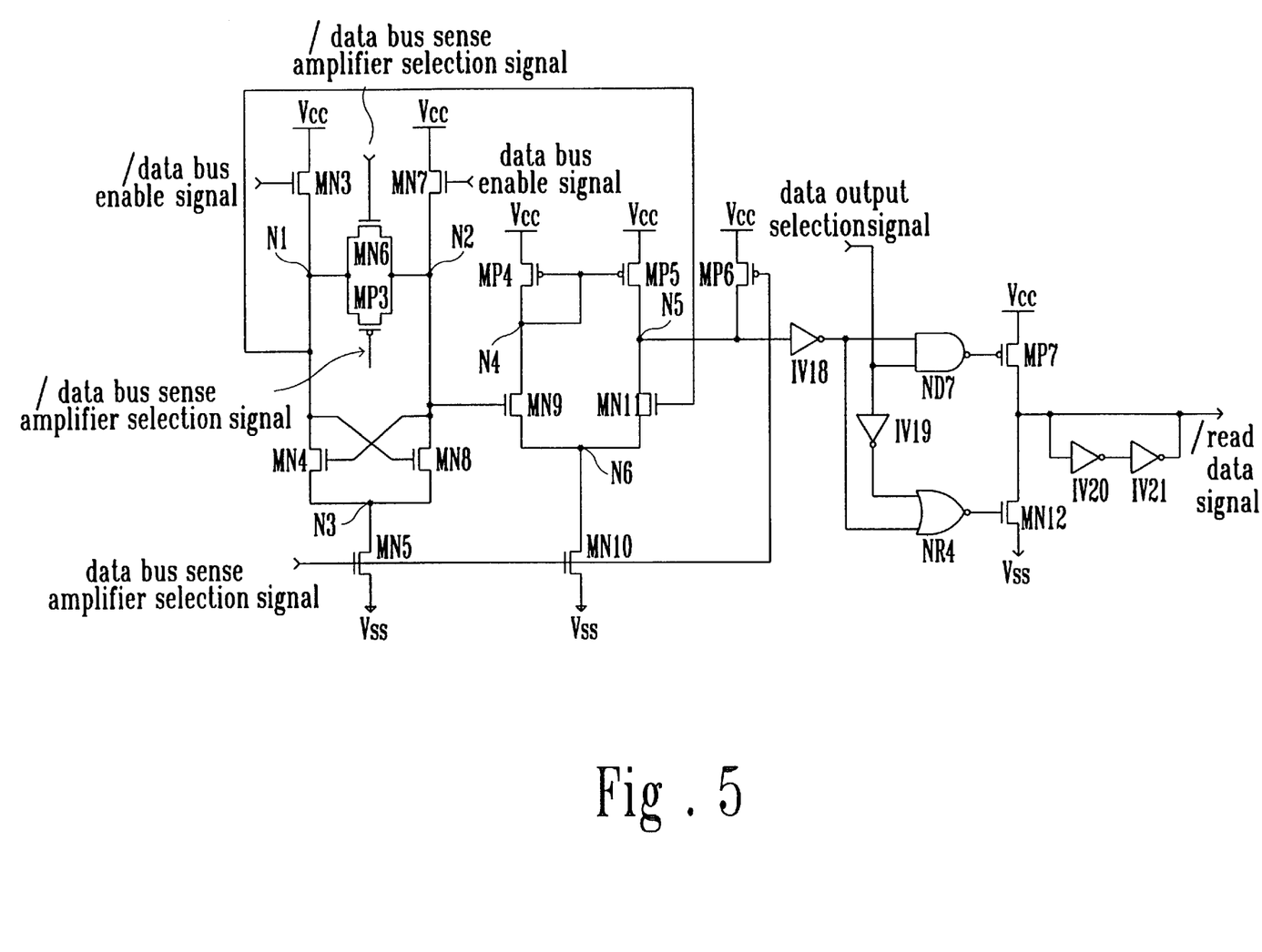
FIG. 5 is a circuit diagram illustrating the construction of the data bus sense amplifier.

For a better understanding of the invention, the constructions of FIGS. 4 and 5 will first be mentioned.

FIG. 4 is a circuit diagram illustrating the construction of the write driver, which drives a data bus line in the write mode. As shown in this drawing, the write driver comprises a fourteenth inverter IV14 for inverting a data input buffer output signal, a third NAND gate ND3 for NANDing an output signal from the fourteenth inverter IV14 and the write bus line driver signal from the write driver driving circuit in FIG. 1, a first PMOS transistor MP1 being turned on in response to an output signal from the third NAND gate ND3 to transfer a supply voltage Vcc to a /data bus enable signal output terminal, a fifteenth inverter IV15 for inverting the output signal from the fourteenth inverter IV14, a fourth NAND gate ND4 for NANDing an output signal from the fifteenth inverter IV15 and the write bus line driver signal, a sixteenth inverter IV16 for inverting an output signal from the fourth NAND gate ND4, and a first NMOS transistor MN1 being turned on in response to an output signal from the sixteenth inverter IV16 to transfer a ground voltage Vss to the /data bus enable signal output terminal.

The write driver further comprises a fifth NAND gate ND5 for NANDing the output signal from the fifteenth inverter IV15 and the write bus line driver signal, a second PMOS transistor MP2 being turned on in response to an output signal from the fifth NAND gate ND5 to transfer the supply voltage Vcc to a data bus enable signal output terminal, a sixth NAND gate ND6 for NANDing the output signal from the fourteenth inverter IV14 and the write bus line driver signal, a seventeenth inverter IV17 for inverting an output signal from the sixth NAND gate ND6, and a second NMOS transistor MN2 being turned on in response to an output signal from the seventeenth inverter IV17 to transfer the ground voltage Vss to the data bus enable signal output terminal.

FIG. 5 is a circuit diagram illustrating the construction of a data bus sense amplifier. As shown in this drawing, the data bus sense amplifier comprises a third NMOS transistor MN3 being turned on in response to a /data bus enable signal from the write driver in FIG. 4 to transfer the supply voltage Vcc to a first node N1, sixth NMOS and third PMOS transistors MN6 and MP3 connected in parallel between the first node N1 and a second node N2, a seventh NMOS transistor MN7 being turned on in response to a data bus enable signal from the write driver in FIG. 4 to transfer the supply voltage Vcc to the second node N2, a fourth NMOS transistor MN4 being turned on in response to a signal at the second node N2 to transfer a signal at a third node N3 to the first node N1, and an eighth NMOS transistor MN8 being turned on in response to a signal at the first node N1 to transfer the signal at the third node N3 to the second node N2. The sixth NMOS transistor MN6 has its gate for inputting a /data bus sense amplifier selection signal, and the third PMOS transistor MP3 has its gate for inputting a data bus sense amplifier selection signal.

The data bus sense amplifier further comprises a fifth NMOS transistor MN5 being turned on in response to the data bus sense amplifier selection signal to transfer the ground voltage Vss to the third node N3, a fourth PMOS transistor MP4 being turned on in response to a signal at a fourth node N4 to transfer the supply voltage Vcc to the fourth node N4, a fifth PMOS transistor MP5 being turned on in response to the signal at the fourth node N4 to transfer the supply voltage Vcc to a fifth node N5, a ninth NMOS transistor MN9 being turned on in response to the signal at the second node N2 to transfer a signal at a sixth node N6 to the fourth node N4, an eleventh NMOS transistor MN11 being turned on in response to the signal at the first node N1 to transfer the signal at the sixth node N6 to the fifth node N5, and a tenth NMOS transistor MN10 being turned on in response to the data bus sense amplifier selection signal to transfer the ground voltage Vss to the sixth node N6.

The data bus sense amplifier further comprises a sixth PMOS transistor MP6 being turned on in response to the data bus sense amplifier selection signal to transfer the supply voltage Vcc to the fifth node N5, an eighteenth inverter IV18 for inverting a signal at the fifth node N5, a seventh NAND gate ND7 for NANDing an output signal from the eighteenth inverter IV18 and a data output selection signal, a seventh PMOS transistor MP7 being turned on in response to an output signal from the seventh NAND gate ND7 to transfer the supply voltage Vcc to a /read data signal output terminal, a nineteenth inverter IV19 for inverting the data output selection signal, a fourth NOR gate NR4 for NORing the output signal from the eighteenth inverter IV18 and an output signal from the nineteenth inverter IV19, a twelfth NMOS transistor MN12 being turned on in response to an output signal from the fourth NOR gate NR4 to transfer the ground voltage Vss to the /read data signal output terminal, and a latch circuit for latching a /read data signal at the /read data signal output terminal. The latch circuit is provided with twentieth and twenty-first inverters IV20 and IV21 connected in series.

The operation of the write driver with the above-mentioned construction of FIG. 4 will hereinafter be described in conjunction with the operation of the write driver driving circuit in FIG. 1.

First, when the data input buffer output signal is high in logic, the output signal from the third NAND gate ND3 becomes high in logic because the write bus line driver signal from the write driver driving circuit in FIG. 1 is high in logic and the output signal from the fourteenth inverter IV14 is low in logic. The high logic signal from the third NAND gate ND3 is applied to a gate of the first PMOS transistor MP1. As a result, the first PMOS transistor MP1 is turned off. The output signal from the fourth NAND gate ND4 becomes low in logic because the write bus line driver signal is high in logic and the output signal from the fifteenth inverter IV15 is high in logic. The low logic signal from the fourth NAND gate ND4 is inverted into high in logic by the sixteenth inverter IV16 and then applied to a gate of the first NMOS transistor MN1. As a result, the first NMOS transistor MN1 is turned on to transfer the ground voltage Vss to the /data bus enable signal output terminal. In result, the /data bus enable signal from the /data bus enable signal output terminal becomes low in logic. The /data bus enable signal of low logic is applied to a /data bus enable signal input terminal of the data bus sense amplifier in FIG. 5. The output signal from the fifth NAND gate ND5 becomes low in logic because the write bus line driver signal is high in logic and the output signal from the fifteenth inverter IV15 is high in logic. The low logic signal from the fifth NAND gate ND5 is applied to a gate of the second PMOS transistor MP2 to turn on the second PMOS transistor MP2. The output signal from the sixth NAND gate ND6 becomes high in logic because the write bus line driver signal is high in logic and the output signal from the fourteenth inverter IV14 is low in logic. The high logic signal from the sixth NAND gate ND6 is inverted into low in logic by the seventeenth inverter IV17 and then applied to a gate of the second NMOS transistor MN2 to turn off the second NMOS transistor MN1. As a result, the supply voltage Vcc is transferred to the data bus enable signal output terminal, thereby causing the data bus enable signal to become high in logic. The data bus enable signal of high logic is applied to a data bus enable signal input terminal of the data bus sense amplifier in FIG. 5.

Figure 2:
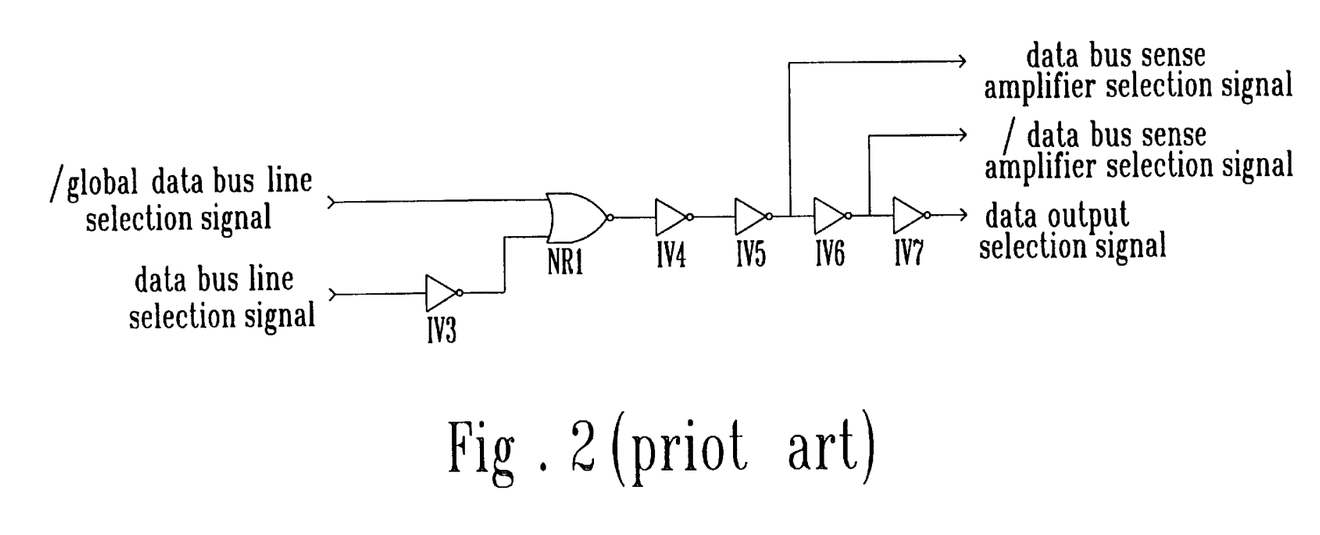
FIG. 2 is a circuit diagram illustrating the construction of a conventional circuit for driving a data bus sense amplifier in a read mode.

FIG. 2 is a circuit diagram illustrating the construction of a conventional circuit for driving the data bus sense amplifier in FIG. 5 in the read mode. As shown in this drawing, the data bus sense amplifier driving circuit comprises a third inverter IV3 for inverting the data bus line selection signal, a first NOR gate NR1 for NORing an output signal from the third inverter IV3 and a /global data bus line selection signal, a fourth inverter IV4 for inverting an output signal from the first NOR gate NR1, a fifth inverter IV5 for inverting an output signal from the fourth inverter IV4 and outputting the inverted signal as the data bus sense amplifier selection signal, a sixth inverter IV6 for inverting an output signal from the fifth inverter IV5 and outputting the inverted signal as the /data bus sense amplifier selection signal, and a seventh inverter IV7 for inverting an output signal from the sixth inverter IV6 and outputting the inverted signal as the data output selection signal.

The data bus line selection signal is enabled high in logic when a certain memory block is selected. The /global data bus line selection signal is made active low in logic in the read mode and disabled high in logic in the write mode.

The operation of the data bus sense amplifier driving circuit with the above-mentioned construction will hereinafter be described.

In the case where the /global data bus line selection signal is made active low in logic under the condition that the data bus line selection signal is made active high in logic, the output signal from the first NOR gate NR1 becomes high in logic. The high logic signal from the first NOR gate NR1 is sequentially inverted by the fourth to seventh inverters IV4–IV7. As a result, the data bus sense amplifier selection signal becomes high in logic, the /data bus sense amplifier selection signal becomes low in logic and the data output selection signal becomes high in logic. These signals are applied respectively to corresponding input terminals of the data bus sense amplifier in FIG. 5.

Now, the operation of the data bus sense amplifier with the above-mentioned construction of FIG. 5 will be described in conjunction with the data bus enable signal and /data bus enable signal in FIG. 4 and the data bus sense amplifier selection signal, /data bus sense amplifier selection signal and data output selection signal in FIG. 2.

In the case where the /data bus enable signal is low in logic and the data bus enable signal is high in logic, the third NMOS transistor MN3 is turned off and the seventh NMOS transistor MN7 is turned on to transfer the supply voltage Vcc to the second node N2. The fourth and ninth NMOS transistors MN4 and MN9 are turned on in response to the signal at the second node N2. Under this condition, if the data bus sense amplifier selection signal is high in logic, the fifth and tenth NMOS transistors MN5 and MN10 are turned on and the sixth PMOS transistor MPG is turned off. As a result, the ground voltage Vss is transferred to the third and sixth nodes N3 and N6 and the resultant low logic signal at the third node N3 is transferred to the first node N1 through the fourth NMOS transistor MN4. The eighth and eleventh NMOS transistors MN8 and MN11 are turned off in response to the low logic signal at the first node N1. The resultant low logic signal at the sixth node N6 is transferred to the fourth node N4 through the ninth NMOS transistor MN9. The fourth and fifth PMOS transistors MP4 and MP5 are turned on in response to the low logic signal at the fourth node N4. As a result, the supply voltage Vcc is transferred to the fifth node N5. The resultant high logic signal at the fifth node N5 is inverted into low in logic by the eighteenth inverter IV18 and then applied to one input terminal of the seventh NAND gate ND7, the other input terminal of which receives the data output selection signal. The low logic signal from the eighteenth inverter IV18 is also applied to one input terminal of the fourth NOR gate NR4, the other input terminal of which receives the output signal from the nineteenth inverter IV19. The output signal from the seventh NAND gate ND7 becomes high in logic because the output signal from the eighteenth inverter IV18 is low in logic and the data output selection signal is high in logic. The high logic signal from the seventh NAND gate ND7 is applied to a gate of the seventh PMOS transistor MP7 to turn off the seventh PMOS transistor MP7. The output signal from the fourth NOR gate NR4 becomes high in logic because the output signals from the eighteenth and nineteenth inverters IV18 and IV19 are both low in logic. The high logic signal from the fourth NOR gate NR4 is applied to a gate of the twelfth NMOS transistor MN12 to turn on the twelfth NMOS transistor MN12. As the twelfth NMOS transistor MN12 is turned on, it transfers the ground voltage Vss to the /read data signal output terminal. As a result, a /read data signal of low logic is outputted at the /read data signal output terminal, namely, a read data signal of high logic is outputted at a read data signal output terminal. At this time, the high logic read data signal is latched by the latch circuit.

As mentioned above, if high logic data is stored in a cell through a data input buffer in the write mode, the same data will be outputted in the read mode.

On the other hand, when the data input buffer output signal is low in logic, namely, when low logic data is stored in a cell in the write mode, a high logic signal is outputted at the /data bus enable signal output terminal in FIG. 4 and a low logic signal is outputted at the data bus enable signal output terminal in FIG. 4 by the constructions of FIGS. 1 and 4. These high and low logic signals are applied respectively to corresponding input terminals of the data bus sense amplifier in FIG. 5.

However, in FIG. 2, because the /global data bus line selection signal is disabled high in logic in the write mode, the data bus sense amplifier selection signal becomes low in logic, the /data bus sense amplifier selection signal becomes high in logic and the data output selection signal becomes low in logic. These signals are applied respectively to the corresponding input terminals of the data bus sense amplifier in FIG. 5. As a result, in FIG. 5, the seventh and twelfth NMOS transistors MN7 and MN12 are turned off, thereby causing the previous data, or the high logic data to be directly outputted at the read data signal output terminal. In other words, provided that low logic data is stored in a cell in the write mode, the same data must be outputted at the output terminal in the read mode. However, because the /global data bus line selection signal is disabled high in logic in the write mode, the data bus sense amplifier is not operated, resulting in the data fail as mentioned above. In order to prevent the data fail, conventionally, data must be read by a corresponding address after a read or write operation is performed according to a different address. In this manner, data can normally be outputted.

Figure 6:
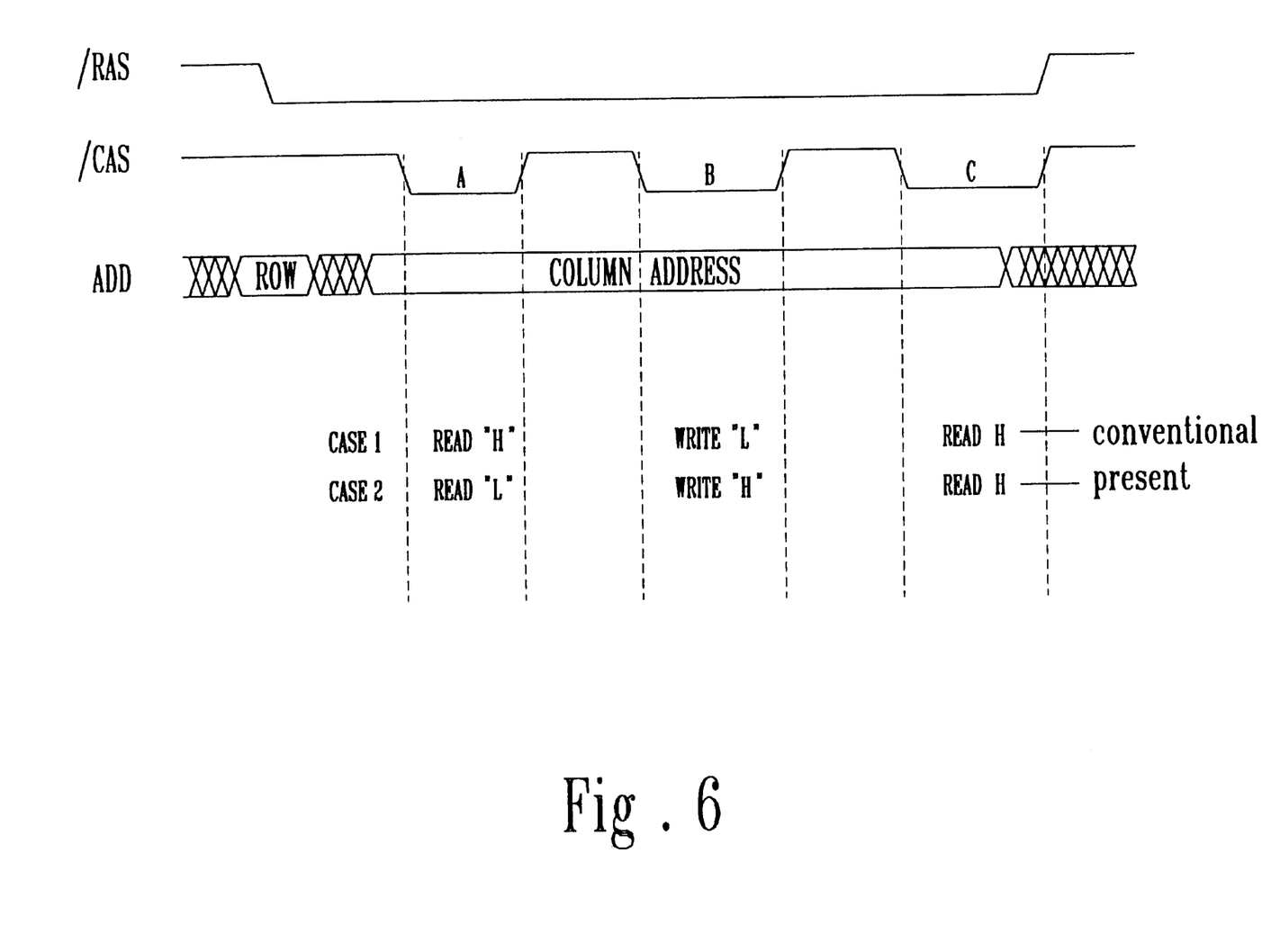
FIG. 6 is a timing diagram showing the relation between the conventional and present output data.

FIG. 6 shows the relation between the conventional and present output data. In this drawing, "case 1" represents the conventional output data. If high logic data was written in a cell, the same data is read from the cell in an interval A. If low logic data was written in the same cell in an interval B after the lapse of predetermined column precharge time, high logic data is outputted from the same cell in an interval C. As a result, the data fail occurs.

In other words, conventionally, the data bus sense amplifier is not operated in the write mode. For this reason, when the write and read operations are repeatedly performed according to a certain address, the data fail occurs in the read mode, resulting in a faulty operation of a semiconductor memory device.

SUMMARY OF THE INVENTION

Therefore, the present invention has been made in view of the above problem, and it is an object of the present invention to provide a semiconductor memory device in which a data bus sense amplifier is driven even in a write mode to change the previous data latched on a read data line, so that normal data can be outputted in a read mode.

In accordance with the present invention, the above and other objects can be accomplished by a provision of a semiconductor memory device with an address transition detector, comprising data bus sense amplifier driving means for driving a data bus sense amplifier in a read mode in response to a global data bus line selection signal and a data bus line selection signal; write driver driving means for driving a write driver in a write mode in response to the data bus line selection signal and a write bus line driver signal generation signal; and first logic means for logically combining output signals from the data bus sense amplifier driving means and write driver driving means to generate a signal to drive the data bus sense amplifier in the write and read modes.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 3:
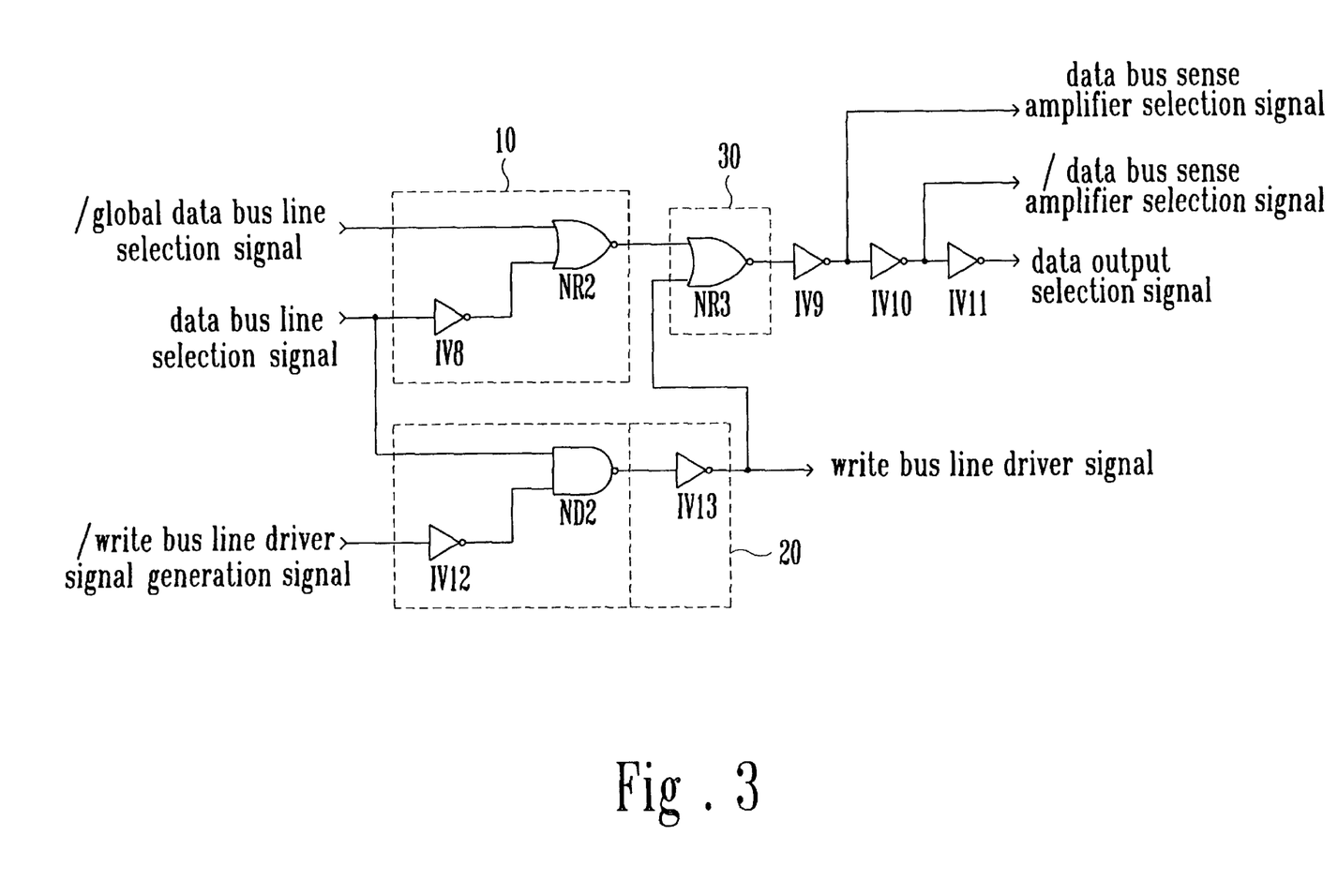
FIG. 3 is a circuit diagram illustrating the construction of a circuit for driving the data bus sense amplifier in the write and read modes in accordance with the present invention.

FIG. 3 is a circuit diagram illustrating the construction of a circuit for driving the data bus sense amplifier in the write and read modes in accordance with the present invention. As shown in this drawing, the data bus sense amplifier driving circuit comprises an eighth inverter IV8 for inverting the data bus line selection signal, a second NOR gate NR2 for NORing an output signal from the eighth inverter IV8 and the /global data bus line selection signal, a twelfth inverter IV12 for inverting the /write bus line driver signal generation signal, a second NAND gate ND2 for NANDing an output signal from the twelfth inverter IV12 and the data bus line selection signal, and a thirteenth inverter IV13 for inverting an output signal from the second NAND gate ND2 and outputting the inverted signal as the write bus line driver signal.

The data bus sense amplifier driving circuit further comprises a third NOR gate NR3 for NORing an output signal from the thirteenth inverter IV13 and an output signal from the second NOR gate NR2, a ninth inverter IV9 for inverting an output signal from the third NOR gate NR3 and outputting the inverted signal as the data bus sense amplifier selection signal, a tenth inverter IV10 for inverting an output signal from the ninth inverter IV9 and outputting the inverted signal as the /data bus sense amplifier selection signal, a nd an eleventh inverter IV11 for inverting an output signal from the tenth inverter IV10 and outputting the inverted signal as the data output selection signal.

The operation of the data bus sense amplifier driving circuit with the above-mentioned construction in accordance with the present invention will hereinafter be described in detail.

First, in the write mode, the /global data bus line selection signal and the data bus line selection signal are high in logic and the /write bus line driver signal generation signal is low in logic. The output signal from the second NOR gate NR2 becomes low in logic because the /global data bus line selection signal is high in logic and the output signal from the eighth inverter IV8 is low in logic. The output signal from the second NAND gate ND2 becomes low in logic because the data bus line selection signal and the output signal from the twelfth inverter IV12 are both high in logic. The low logic signal from the second NOR gate NR2 is applied to one input terminal of the third NOR gate NR3. The low logic signal from the second NAND gate ND2 is inverted into high in logic by the thirteenth inverter IV13 and then applied to the other input terminal of the third NOR gate NR3. As a result, the output signal from the third NOR gate NR3 becomes low in logic. The low logic signal from the third NOR gate NR3 is sequentially inverted by the ninth to eleventh inverters IV9–IV11. In result, the data bus sense amplifier selection signal becomes high in logic, the /data bus sense amplifier selection signal becomes low in logic and the data output selection signal becomes high in logic. Therefore, in the write mode, the write bus line driver signal of high logic is applied to the write driver in FIG. 4 to drive it. Also, the data bus sense amplifier selection signal of high logic, /data bus sense amplifier selection signal of low logic and data output selection signal of high logic are applied to the data bus sense amplifier in FIG. 5 to drive it.

In the read mode, the data bus line selection signal and the /write bus line driver signal generation signal are high in logic and the /global data bus line selection signal is low in logic. As a result, the output signal from the second NOR gate NR2 becomes high in logic and the output signal from the thirteenth inverter IV13 becomes low in logic. Because the output signal from the thirteenth inverter IV13, or the write bus line driver signal is low in logic, the write driver in FIG. 4 is not operated in the read mode. The output signal from the third NOR gate NR3 becomes low in logic because the output signal from the second NOR gate NR2 becomes high in logic and the output signal from the thirteenth inverter IV13 becomes low in logic. As a result, the data bus sense amplifier selection signal becomes high in logic, the /data bus sense amplifier selection signal becomes low in logic and the data output selection signal becomes high in logic.

As mentioned above, according to the present invention, the data bus sense amplifier selection signal, /data bus sense amplifier selection signal and data output selection signal are enabled even in the write mode to drive the data bus sense amplifier.

Now, the operations of the write driver and data bus sense amplifier in FIGS. 4 and 5 will be mentioned in conjunction with the output signals from the data bus sense amplifier driving circuit in FIG. 3.

First, the operation of the write driver of FIG. 4 in the write mode will be mentioned.

In the case where low logic data is to be stored in a cell, the write bus line driver signal is high in logic and the data input buffer output signal is low in logic. As a result, the /data bus enable signal becomes high in logic and the data bus enable signal becomes low in logic.

Then, the operation of the data bus sense amplifier of FIG. 5 in the read mode will be mentioned.

In the read mode, the data bus sense amplifier is adapted to amplify the low logic data stored in the cell and transfer the amplified data to the read data line. Because the write driver of FIG. 4 is not operated in the read mode, the /data bus enable signal of high logic and data bus enable signal of low logic in the write mode are applied to the data bus sense amplifier. As a result, the third NMOS transistor MN3 is turned on to transfer the supply voltage Vcc to the first node N1, and the seventh NMOS transistor MN7 is turned off. The eighth and eleventh NMOS transistors MN8 and MN11 are turned on in response to the supply voltage Vcc at the first node N1. Under this condition, if the data bus sense amplifier selection signal is high in logic, the /data bus sense amplifier selection signal is low in logic and the data output selection signal is high in logic, the fifth and tenth NMOS transistors MN5 and MN10 are turned on and the sixth PMOS transistor MP6 is turned off. As a result, the ground voltage Vss is transferred to the fifth node N5. The resultant low logic signal at the fifth node N5 is inverted into high in logic by the eighteenth inverter IV18 and then applied to one input terminal of the seventh NAND gate ND7, the other input terminal of which receives the data output selection signal of high logic. As a result, the output signal from the seventh NAND gate ND7 becomes low in logic. The low logic signal from the seventh NAND gate ND7 is applied to the gate of the seventh PMOS transistor MP7 to turn on the seventh PMOS transistor MP7. As the seventh PMOS transistor MP7 is turned on, it transfers the supply voltage Vcc to the /read data signal output terminal. As a result, a /read data signal of high logic is outputted at the /read data signal output terminal, namely, a read data signal of low logic is outputted at the read data signal output terminal. In result, low logic data is latched by the latch circuit and then transferred to the read data line.

In brief, in the read mode, the low logic data stored in the cell in the write mode is amplified and latched by the data bus sense amplifier and then transferred to a data output buffer.

Next, in the case where high logic data is to be written in the same cell selected by the same address, the /data bus enable signal from the write driver in FIG. 4 becomes low in logic and the data bus enable signal therefrom becomes high in logic.

In the write mode, in FIG. 5, the /data bus enable signal of low logic and data bus enable signal of high logic from the write driver in FIG. 4 are applied to the data bus sense amplifier. As a result, the third NMOS transistor MN3 is turned off and the seventh NMOS transistor MN7 is turned on to transfer the supply voltage Vcc to the second node N2. The fourth and ninth NMOS transistors MN4 and MN9 are turned on in response to the supply voltage Vcc at the second node N2. Under this condition, if the data bus sense amplifier selection signal is high in logic, the /data bus sense amplifier selection signal is low in logic and the data output selection signal is high in logic, the fifth and tenth NMOS transistors MN5 and MN10 are turned on and the sixth PMOS transistor MP6 is turned off. As a result, the ground voltage Vss is transferred to the first node N1, thereby causing the eighth and eleventh NMOS transistors MN8 and MN11 to be turned off. Also, the ground voltage Vss is transferred to the fourth node N4, thereby causing the fourth and fifth PMOS transistors MP4 and MP5 to be turned on. As a result, the supply voltage Vcc is transferred to the fifth node N5. The resultant high logic signal at the fifth node N5 is inverted into low in logic by the eighteenth inverter IV18 and then applied to one input terminal of the seventh NAND gate ND7, the other input terminal of which receives the data output selection signal.

Because the output signal from the eighteenth inverter IV18 is low in logic and the data output selection signal is high in logic, the output signal from the seventh NAND gate ND7 becomes high in logic, thereby causing the seventh PMOS transistor MP7 to be turned off. The output signal from the fourth NOR gate NR4 becomes high in logic because the output signals from the eighteenth and nineteenth inverters IV18 and IV19 are both low in logic. The twelfth NMOS transistor MN12 is turned on in response to the high logic signal from the fourth NOR gate NR4 to transfer the ground voltage Vss to the /read data signal output terminal. As a result, a /read data signal of low logic, or a read data signal of high logic is latched by the latch circuit. In other words, the data bus sense amplifier is driven even in the write mode to change the previous low data to the current high data for preparation for the next read operation.

In the subsequent read mode, the write driver of FIG. 4 is not operated, thereby causing the /data bus enable signal of low logic and data bus enable signal of high logic in the preceding write mode to be applied to the data bus sense amplifier. The operation of the data bus sense amplifier in the read mode is the same as that in the write mode and a description thereof will thus be omitted. In result, the high logic data latched by the latch circuit is outputted.

In FIG. 6, "case 2" represents the output data of the present invention. If low logic data was written in a cell, the same data is read from the cell in an interval A. If high logic data was written in the same cell in an interval B after the lapse of predetermined column precharge time, the same data is outputted from the same cell in an interval C.

As apparent from the above description, according to the present invention, the data bus sense amplifier is driven even in the write mode to change the previous data latched by the latch circuit. Therefore, in the case where data stored in a cell in the write mode is outputted in the read mode by a corresponding address and different data is then stored in the same cell, the different data can normally be read directly by the corresponding address without performing the read or write operation according to a different address.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device, comprising:

data bus sense amplifier driving means for driving a data bus sense amplifier in a read mode in response to a global data bus line selection signal and a data bus line selection signal;

write driver driving means for driving a write driver in a write mode in response to said data bus line selection signal and a write bus line driver signal generation signal; and first logic means for logically combining output signals from said data bus sense amplifier driving means and said write driver driving means to generate a signal to drive said data bus sense amplifier in said write and read modes.

2. The semiconductor memory device, as set forth in claim 1, wherein said data bus sense amplifier driving means includes:

inversion means for inverting said data bus line selection signal; and second logic means for logically combining said global data bus line selection signal and an output signal from said inversion means to generate a signal to drive said data bus sense amplifier.

3. The semiconductor memory device, as set forth in claim 2, wherein said second logic means includes a NOR gate.

4. The semiconductor memory device, as set forth in claim 1, wherein said write driver driving means includes:

inversion means for inverting said write bus line driver signal generation signal; and second logic means for logically combining said data bus line selection signal and an output signal from said inversion means to generate a signal to drive said write driver.

5. The semiconductor memory device, as set forth in claim 4, wherein said second logic means includes an AND gate.

6. The semiconductor memory device, as set forth in claim 1, wherein said first logic means includes a NOR gate.

* * * * *